(12) United States Patent
Ohmi et al.

(10) Patent No.: US 7,863,713 B2
(45) Date of Patent: *Jan. 4, 2011

(54) SEMICONDUCTOR DEVICE

(75) Inventors: Tadahiro Ohmi, Miyagi (JP); Akinobu Teramoto, Miyagi (JP); Kazufumi Watanabe, Miyagi (JP)

(73) Assignees: Tohoku University, Miyagi (JP); Foundation for Advancement of International Science, Ibaraki (JP)

( * ) Notice: Subject to any disclaimer, the term of this patent is extended or adjusted under 35 U.S.C. 154(b) by 25 days.

This patent is subject to a terminal disclaimer.

(21) Appl. No.: 12/086,886

(22) PCT Filed: Dec. 20, 2006

(86) PCT No.: PCT/JP2006/325340

§ 371 (c)(1),
(2), (4) Date: Jun. 20, 2008

(87) PCT Pub. No.: WO2007/072844

PCT Pub. Date: Jun. 28, 2007

(65) Prior Publication Data

US 2009/0001471 A1    Jan. 1, 2009

(30) Foreign Application Priority Data

Dec. 22, 2005 (JP) .............................. 2005-369170

(51) Int. Cl.
*H01L 29/04* (2006.01)

(52) U.S. Cl. .................. 257/628; 257/351; 257/352; 257/627; 257/E29.003; 257/E29.004; 257/E27.112

(58) Field of Classification Search ................. 257/351, 257/352, 627, 628, E29.003, E29.004, E27.112
See application file for complete search history.

(56) References Cited

U.S. PATENT DOCUMENTS 4,768,076 A * 8/1988 Aoki et al. .................. 257/70

(Continued)

FOREIGN PATENT DOCUMENTS

EP    0 818 819 A1    1/1998

(Continued)

OTHER PUBLICATIONS

G. Gildenblat, "One-flux Theory of a Non-absorbing Barrier," Journal of Applied Physics, vol. 91:12, Jun. 2002, pp. 9883-9886.

*Primary Examiner*—Long K Tran
(74) *Attorney, Agent, or Firm*—Foley & Lardner LLP

(57) ABSTRACT

For equalizing the rising and falling operating speeds in a CMOS circuit, it is necessary to make the areas of a p-type MOS transistor and an n-type MOS transistor different from each other due to a difference in carrier mobility therebetween. This area unbalance prevents an improvement in integration degree of semiconductor devices. The NMOS transistor and the PMOS transistor each have a three-dimensional structure with a channel region on both the (100) plane and the (110) plane so that the areas of the channel regions and gate insulating films of both transistors are equal to each other. Accordingly, it is possible to make the areas of the gate insulating films and so on equal to each other and also to make the gate capacitances equal to each other. Further, the integration degree on a substrate can be improved twice as much as that in the conventional technique.

27 Claims, 14 Drawing Sheets

U.S. PATENT DOCUMENTS

| | | | |
|---|---|---|---|
| 6,037,610 A * | 3/2000 | Zhang et al. | 257/64 |
| 6,900,503 B2 | 5/2005 | Oh et al. | |
| 6,903,393 B2 | 6/2005 | Ohmi et al. | |
| 2005/0275018 A1 | 12/2005 | Venkatesan et al. | |
| 2006/0084244 A1 * | 4/2006 | Yeo et al. | 438/478 |
| 2007/0132009 A1 | 6/2007 | Takeuchi et al. | |

FOREIGN PATENT DOCUMENTS

| | | |
|---|---|---|
| JP | 07-086422 | 3/1995 |
| JP | 2003-115587 A | 4/2003 |
| JP | 2005-327766 A | 11/2005 |
| KR | 1998-0012115 | 4/1998 |
| KR | 10-0450683 | 3/2004 |
| WO | WO 2005/036651 A1 | 4/2005 |

* cited by examiner

FIG. 7(a)
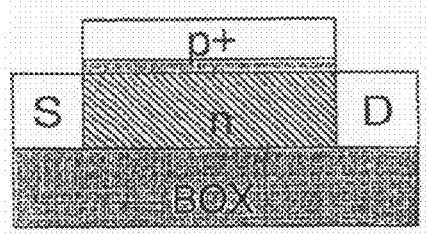
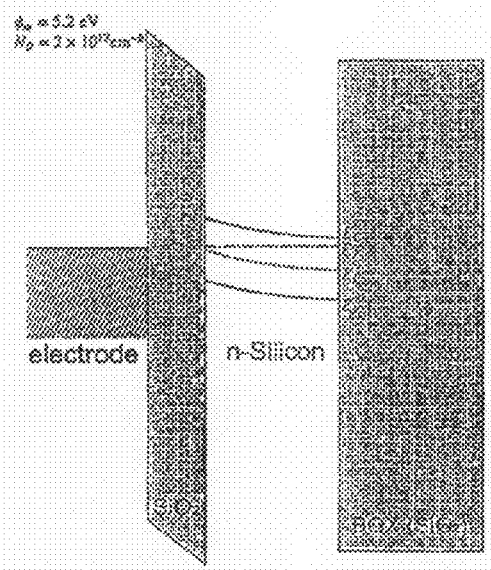
FIG. 7(b)
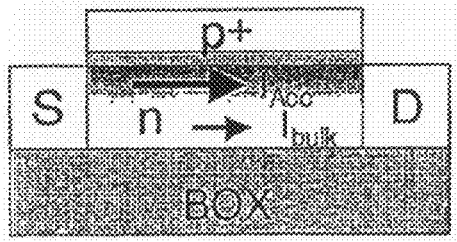
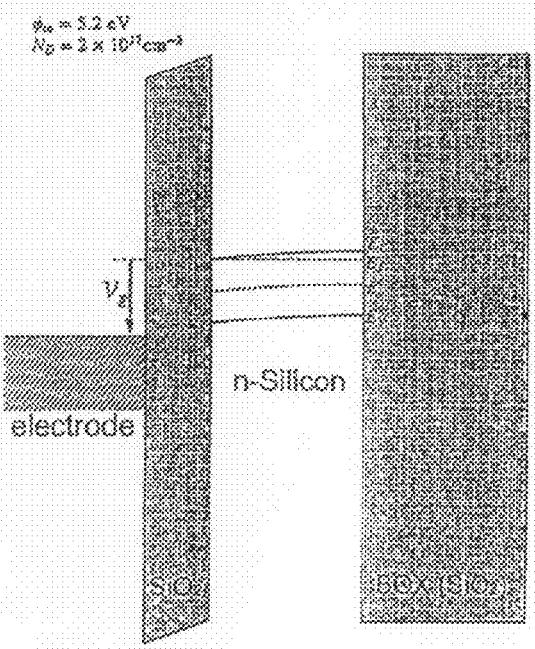

FIG. 12(a)
CONVENTIONAL
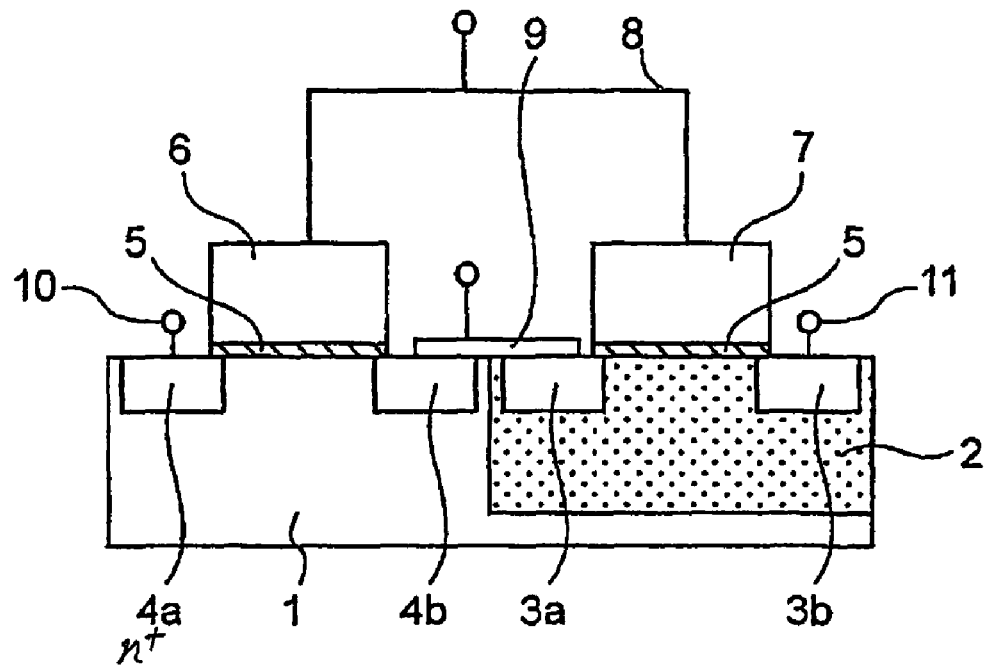

US 7,863,713 B2

SEMICONDUCTOR DEVICE

TECHNICAL FIELD

This invention relates to a semiconductor device such as an IC or LSI.

BACKGROUND ART

Normally, a CMOS inverter circuit as shown in FIG. 12 is used in a semiconductor device. FIG. 12(a) exemplarily shows a section of the CMOS inverter circuit and FIG. 12(b) shows a plan view thereof. For simplification, illustration of lines 8 to 11 is omitted in FIG. 12(b).

In FIG. 12(a), 1 denotes a p-type semiconductor substrate where an electronic circuit is formed; 2 denotes an n-type impurity region formed in the p-type semiconductor substrate 1; 3a and 3b denote high-concentration p-type impurity regions formed in the n-type impurity region 2; 4a and 4b denote high-concentration n-type impurity regions formed in the p-type semiconductor substrate 1; 5 denotes gate insulating films of $SiO_2$ or the like for insulation between a gate electrode 6 and the p-type semiconductor substrate 1 and between a gate electrode 7 and the n-type impurity region 2, respectively; and 6 and 7 denote the gate electrodes formed on the gate insulating films 5, respectively.

Herein, the n-type impurity region 2, the high-concentration p-type impurity regions 3a and 3b, and the gate electrode 7 form a p-channel MOSFET (Metal Oxide Semiconductor Field Effect Transistor). On the other hand, the semiconductor substrate 1, the high-concentration n-type impurity regions 4a and 4b, and the gate electrode 6 form an n-channel MOSFET. A gate line 8 is connected to the gate electrodes 6 and 7 of the n-channel MOSFET and the p-channel MOSFET and serves to apply a common voltage as an input signal of the CMOS inverter circuit while an output line 9 is connected to the drain electrode (high-concentration p-type impurity region 3a) of the p-channel MOSFET and the drain electrode (high-concentration n-type impurity region 4b) of the n-channel MOSFET to produce an output signal of the CMOS inverter. Power supply lines 10 and 11 are connected to the source electrode (high-concentration n-type impurity region 4a) of the n-channel MOSFET and the source electrode (high-concentration p-type impurity region 3b) of the p-channel MOSFET, respectively, to provide power supply potentials.

The operation of this CMOS inverter circuit will be described. In the illustrated CMOS inverter circuit comprising the p-channel MOSFET and the n-channel MOSFET of FIG. 12(a), the power supply line 10 which is connected to the source electrode of the n-channel transistor is grounded (0V) and the power supply voltage (e.g. 5V) is applied to the power supply line 11 connected to the source electrode of the p-channel transistor. When an input signal of 0V is applied to the gate line 8, the n-channel transistor is turned off while the p-channel transistor is turned on. Therefore, the power supply voltage (5V) is given to the power supply line 11 and is output to the output line 9. On the other hand, when the input signal of 5V is applied to the gate line 8, conversely to the above case, the n-channel transistor is turned on while the p-channel transistor is turned off. As a result, the ground voltage (0V) which is given to the power supply line 10 is output to the output line.

In this CMOS type circuit, the current hardly flows in the transistors when the output does not change in accordance with an input and it mainly flows when the output changes. That is, when the gate line 8 becomes 0V, an output current for charging the output line 9 flows through the p-channel transistor, while, when the gate line 8 becomes 5V, an output current for discharging the charge of the output line 9 flows through the n-channel transistor. In this manner, the CMOS circuit of FIG. 12(a) is formed as an inverter circuit adapted to output a signal with a polarity reverse to that of the input. In this inverter circuit, it is necessary to cause the same current to flow in the p-channel transistor and the n-channel transistor for equalizing the rising speed and the falling speed upon switching.

However, for example, on the (100) plane, the mobility of holes serving as carriers in the p-channel transistor is lower than that of electrons serving as carriers in the n-channel transistor and the ratio is 1:3. Therefore, if the p-channel transistor and the n-channel transistor have the same area, there occurs a difference in current driving capability therebetween and thus the operating speeds cannot be the same. Accordingly, as shown in FIG. 12(b), the areas of the drain electrode 3a, the source electrode 3b, and the gate electrode 7 of the p-channel transistor are set larger than those of the drain electrode 4b, the source electrode 4a, and the gate electrode 6 of the n-channel transistor corresponding to their mobility ratio to substantially equalize the current driving capabilities, thereby making the switching speeds equal to each other. However, this makes the area occupied by the p-channel transistor three times wider than that of the n-channel transistor and thus the areas occupied by the p-channel transistor and the n-channel transistor become unbalanced, which has been a barrier to improve integration degree of semiconductor devices.

As a prior document relating to improvement in current driving capability of a p-channel transistor, there is Patent Documents mentioned below. In Patent Document 1, the current driving capability of a p-channel transistor is improved by using the (110) plane. Further, Patent Document 2 describes that the current driving capability of a p-channel transistor is improved by using an SOI substrate and forming an accumulation-mode p-channel transistor on the SOI substrate. However, when an arbitrary substrate is used, it is impossible to actually equalize the current driving capabilities of an n-channel transistor and a p-channel transistor having the same size in an ON-state. Further, in the accumulation-mode transistor disclosed in Patent Document 2, a substrate electrode is essential in addition to a gate electrode and a voltage adapted to form a depletion layer in a channel region to pinch off a channel should be applied to both electrodes, and therefore, there has been a drawback in that it is complicated in terms of structure and circuit.

Patent Document 1: Japanese Unexamined Patent Application Publication (JP-A) No. 2003-115587
Patent Document 2: Japanese Unexamined Patent Application Publication (JP-A) No. H07-086422

DISCLOSURE OF THE INVENTION

Problem to be Solved by the Invention

As described above, in the CMOS circuit using the (100) crystal plane, the current driving capabilities of the n-channel transistor and the p-channel transistor having the same size differ from each other and thus there is a difference in switching speed. In order to make the switching speeds (rising and falling) equal to each other, it is necessary to increase a channel width of the p-channel transistor. Therefore, the areas occupied by the n-channel transistor and the p-channel transistor become unbalanced, which has been a barrier to improvement in integration degree of semiconductor devices.

In the prior-application Patent Document 1, the current driving capability of the p-channel transistor is improved, but it is insufficient to make the sizes of the n-channel transistor and the p-channel transistor equal to each other.

It is an object of this invention to obtain a semiconductor device that enables an increase in integration degree by making the switching speeds of a pair of transistors of different conductivity types, forming a CMOS circuit, substantially equal or equivalent to each other and making the areas of electrodes thereof substantially equal or equivalent to each other.

Means to Solve the Problem

According to claims 1 or 2, a semiconductor device comprises a circuit having at least a pair of transistors of different channel conductivity types on an SOI substrate, wherein an n-channel transistor is formed using a first semiconductor layer provided on the SOI substrate and a first gate insulating layer covering at least part of a surface of the first semiconductor layer, a p-channel transistor is formed using a second semiconductor layer provided on the SOI substrate and a second gate insulating layer covering at least part of a surface of the second semiconductor layer, a surface of a first region for forming a channel of the first semiconductor layer has a (100) plane or a plane within ±10° from the (100) plane, a surface of a second region for forming a channel on a side of the first semiconductor layer has one or a plurality of planes adapted to provide a smaller mobility of electrons than the plane within ±10° from the (100) plane, a surface of a first region for forming a channel of the second semiconductor layer has a (100) plane or a plane within ±10° from the (100) plane, a surface of a second region for forming a channel on a side of the second semiconductor layer has one or a plurality of planes adapted to provide a greater mobility of holes than the plane within ±10° from the (100) plane, and widths, lengths, and heights of the surfaces of said first regions and widths, lengths, and heights of the surfaces of the second regions are determined so that the sum of an area of the surface of the first region and an area of the surface of the second region in the first semiconductor layer and the sum of an area of the surface of the first region and an area of the surface of the second region in the second semiconductor layer are equal to each other and, further, operating speeds of the n-channel transistor and the p-channel transistor are substantially equal or equivalent to each other.

In a semiconductor device according to claim 2, the n-channel transistor and the p-channel transistor are each normally off, the n-channel transistor is of an inversion mode or an accumulation mode, and the p-channel transistor is of the inversion mode or the accumulation mode.

In a semiconductor device according to claim 3, the n-channel transistor and the p-channel transistor are each of the inversion mode.

In a semiconductor device according to claim 4, the n-channel transistor and the p-channel transistor are each of the accumulation mode.

In a semiconductor device according to claim 5, the n-channel transistor is of the inversion mode and the p-channel transistor is of the accumulation mode.

In a semiconductor device according to claim 6, the n-channel transistor is of the accumulation mode and the p-channel transistor is of the inversion mode.

In a semiconductor device according to claim 7, a material of a second gate electrode provided on the second gate insulating film and an impurity concentration in the second semiconductor layer are selected so that a thickness of a depletion layer formed in the second semiconductor layer by a work function difference between the second gate electrode and the second semiconductor layer becomes greater than that of the second semiconductor layer.

In a semiconductor device according to claim 8, wherein a material of a first gate electrode provided on the first gate insulating film and an impurity concentration in the first semiconductor layer are selected so that a thickness of a depletion layer formed in the first semiconductor layer by a work function difference between the first gate electrode and the first semiconductor layer becomes greater than that of the first semiconductor layer.

In a semiconductor device according 9, wherein the first and second gate insulating films each contain at least one kind of $SiO_2$, $Si_3N_4$, a metal silicon alloy oxide film, and a metal silicon alloy nitride film formed by microwave-excited plasma.

In the semiconductor device according to claim 10, the gate insulating films are formed at a temperature of 600° C. or less using microwave-excited plasma.

In a semiconductor device according to 11 or 12, the lengths of the surfaces of the first regions and the lengths of the surfaces of the second regions, forming channel lengths, are determined so as to be substantially equal to each other in the n-channel transistor and the p-channel transistor. Since the width of the surface of the first region is subjected to the restriction about the width of the surface of the first region according to claim 12, it can be uniquely determined by determining the channel length. Accordingly, it is only required to determine the width of the surface of the second region.

A semiconductor device comprises a circuit having at least a pair of transistors of different conductivity types, wherein a transistor of one conductivity type is formed using a first semiconductor layer provided on an SOI substrate and a first gate insulating layer covering at least part of a surface of the first semiconductor layer, a transistor of another conductivity type is formed using a second semiconductor layer provided on the SOI substrate and a second gate insulating layer covering at least part of a surface of the second semiconductor layer; a surface of a first region for forming a channel of the first semiconductor layer has a first crystal plane, a surface of a second region provided on a plane crossing the surface of the first region for forming a channel on a side of the first semiconductor layer has a second crystal plane different from the first crystal plane and adapted to provide a different mobility of carriers than the first crystal plane; a surface of a first region for forming a channel of the second semiconductor layer has a first crystal plane, a surface of a second region provided on a plane crossing the surface of said first region for forming a channel on a side of the first semiconductor layer has a second crystal plane different from the first crystal plane and adapted to provide a different mobility of carriers than the first crystal plane; and, given that an effective mass of electrons at the surface of the first region for forming the channel of said first semiconductor layer is me1, an effective mass of electrons at the surface of the second region is me2, an effective mass of holes at the surface of the first region for forming the channel of the second semiconductor layer is mh1, an effective mass of holes at the surface of the second region is mh2, a width of the surface of the first region for forming the channel of the first semiconductor layer is We, a width of the surface of the second region for forming the channel of the first semiconductor layer is He, a width of the surface of the second region for forming the channel of the second semiconductor layer is Wh, a width of the surface of the second region for forming the channel of the second semiconductor layer is Hh, a length of the surface of the first region for forming the channel of the first semiconductor layer is L1, and a length of the surface of the first region for forming the channel of the second semiconductor layer is L2, an actual effective electron mass mee of the first semiconductor layer and an actual effective hole mass mhe of the first semiconductor layer when L1, We, L2, and Wh are set to predetermined values are respectively expressed by $$mee=(me1^{-1} \times We/(2 \times He+We)+2 \times me2^{-1} \times He/(2 \times He+We))^{-1}$$

$$mhe=(mh1^{-1} \times Wh/(2 \times Hh+Wh)+2 \times mh2^{-1} \times Hh/(2 \times Hh+Wh))^{-1},$$

wherein He and Hh are determined so as to establish mee=mhe and to satisfy We=Wh and He=Hh, thereby configuring the transistor of one conductivity type and the transistor of another conductivity type so that areas of channel regions thereof are substantially equal or equivalent to each other and operating speeds thereof are substantially equal or equivalent to each other. Herein, the second region is formed at a portion where a side surface of the first semiconductor layer is in the form of an inclined plane or a perpendicular plane, and may be formed using only one of both side surfaces or using both side surfaces partly from their top or entirely from their top to bottom.

A semiconductor device according to claim 13, wherein, by setting said L1 and said L2 to be equal to each other, remaining He and Hh are determined so as to substantially satisfy We=Wh and to set We and Wh to a predetermined value so as to satisfy 1.5×L1>We and 1.5×L2>Wh by setting the lengths of the surfaces of said first regions to be 1.5 times or more longer than the widths of the surfaces of said first regions, respectively, and further to satisfy mee=mhe and He=Hh.

According to claim 17 of the invention, there is obtained a semiconductor device comprising a circuit having at least a pair of a first conductivity type channel transistor and a second conductivity type channel transistor, a second conductivity type different from a first conductivity type, wherein the first conductivity type channel transistor comprises a first semiconductor layer provided on an SOI substrate, a first gate insulating layer covering at least part of a surface of the first semiconductor layer, and a first gate electrode covering the first gate insulating layer; and the second conductivity type channel transistor comprises a second semiconductor layer provided on the SOI substrate, a second gate insulating layer covering at least part of a surface of the second semiconductor layer, and a second gate electrode covering the second gate insulating layer; and wherein a first region where a channel of the first semiconductor layer is formed has a first plane forming the surface of the first semiconductor layer and one or a plurality of second planes forming a predetermined angle with the first plane and adapted to provide a smaller mobility of carriers of the first conductivity type channel transistor than the first plane; a second region where a channel of the second semiconductor layer is formed has a first plane forming the surface of the second semiconductor layer and one or a plurality of second planes forming a predetermined angle with the first plane and adapted to provide a greater mobility of carriers of the second conductivity type channel transistor than the first plane; and a width, a length, and a height of a surface of the first region and a width, a length, and a height of a surface of the second region are set so that the sum of an area of the first plane of the first region and an area of the second plane of the first region in the first semiconductor layer is substantially equal to the sum of an area of the first plane of the second region and an area of the second plane of the second region in the second semiconductor layer and, further, operating speeds of the first conductivity type channel transistor and the second conductivity type channel transistor are substantially equal or equivalent to each other.

In accordance with one aspect of the invention, in the invention of claim 24, the first conductivity type channel transistor is an NMOS transistor, the second conductivity type channel transistor is a PMOS transistor, the first plane of each of the first and second semiconductor layers is a (100) plane of silicon or a plane within ±10° from the (100) plane, and the second plane thereof is a (110) plane of silicon or a plane within ±10° from the (110) plane.

In accordance with another aspect of the invention, in the invention of claim 17, the first plane of each of the first and second semiconductor layers is a (110) plane of silicon or a plane within ±10° from the (110) plane, the second plane thereof is a (100) plane of silicon or a plane within ±10° from the (100) plane, the first conductivity type channel transistor is a PMOS transistor, and the second conductivity type channel transistor is an NMOS transistor.

In accordance with a further aspect of the invention, in the invention of claim 17, the first conductivity type channel transistor and the second conductivity type channel transistor are each of an inversion mode.

The first conductivity type channel transistor and the second conductivity type channel transistor may be each of an accumulation mode.

The first conductivity type channel transistor may be of an inversion mode and the second conductivity type channel transistor may be of an accumulation mode.

In accordance with an aspect of the invention, in the invention of claim 24, it is preferable that a material of the second gate electrode provided on the second gate insulating film and an impurity concentration in the second semiconductor layer are selected so that a thickness of a depletion layer formed in the second semiconductor layer by a work function difference between the second gate electrode and the second semiconductor layer becomes greater than that of the second semiconductor layer.

In accordance with another aspect of the invention, in the invention of claim 17, a material of the first gate electrode provided on the first gate insulating film and an impurity concentration in the first semiconductor layer may be selected so that a thickness of a depletion layer formed in the first semiconductor layer by a work function difference between the first gate electrode and the first semiconductor layer becomes greater than that of the first semiconductor layer.

In accordance with other aspect of the invention, in the invention of claim 17, the lengths of the surfaces of the first and second regions forming channel lengths of the first conductivity type channel transistor and the second conductivity type channel transistor, respectively, are set so as to be equal to each other.

Further, in the invention of claim 17, the lengths of the surfaces of the first and second regions forming channel lengths of the first conductivity type channel transistor and the second conductivity type channel transistor, respectively, are 1.5 times or more longer than the widths of the surfaces of the first and second regions, respectively.

According to this invention, with the foregoing structure, it is possible to obtain a p-channel MOS transistor and an n-channel MOS transistor having the same current driving capability and to equalize the channel areas of both transistors and, therefore, there is an effect of obtaining a semiconductor device having the same switching speed and capable of increasing the integration degree.

BRIEF DESCRIPTION OF THE DRAWINGS

FIG. 7(a) and FIG. 7(b) are diagrams for explaining a depletion state and an accumulation state, respectively, of the accumulation-mode n-MOS transistor used in the embodiments 2 and 3 of this invention, wherein each figure shows the structure of the n-MOS transistor and the band structure thereof.

BEST MODE FOR CARRYING OUT THE INVENTION

Hereinbelow, semiconductor devices of this invention will be described with reference to the drawings.

Embodiment 1

Figure 1:
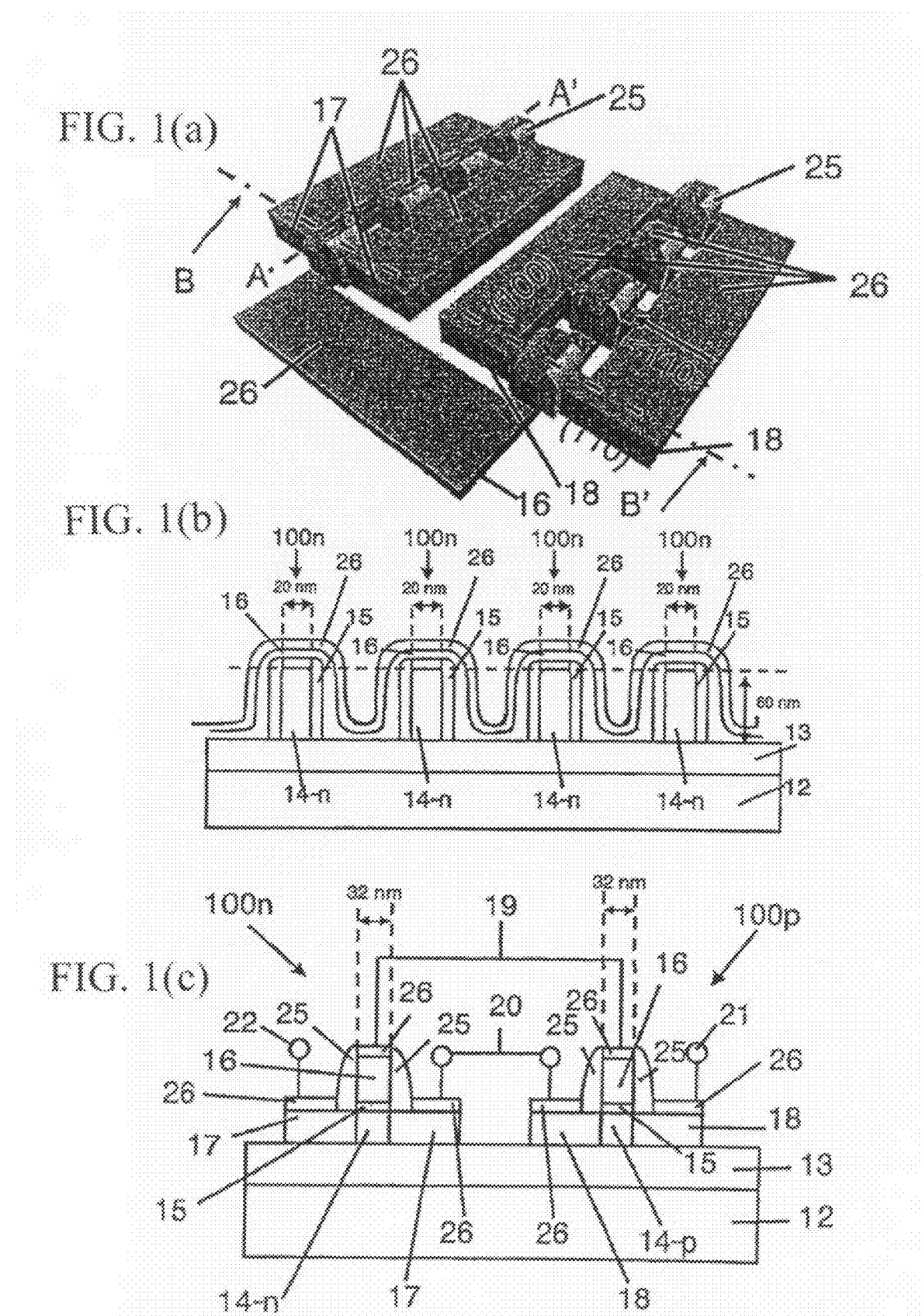
FIG. 1 is diagrams showing a semiconductor device according to a first embodiment of this invention, wherein (a) is a perspective view, and (b) and (c) are sectional views taken along line A-A' and line B-B' in FIG. 1(a), respectively.

Referring to FIG. 1, a semiconductor device according to an embodiment 1 of this invention will be described. FIG. 1(a) shows a schematic perspective view of the semiconductor device according to the embodiment 1 of this invention, FIG. 1(b) shows a sectional view taken along line A-A' in FIG. 1(a), and FIG. 1(c) shows a sectional view taken along line B-B' in FIG. 1(a).

The embodiment 1 shown in FIG. 1 comprises n-channel transistors (NMOS transistors) and p-channel transistors (PMOS transistors) having the balanced current driving capability and each having a three-dimensional structure. The illustrated n-channel transistors and p-channel transistors are characterized by being SOI-type three-dimensional structure CMOS devices having completely the same device structure (shape and size) and each having a gate length of 45 nm or less.

FIG. 1(a) shows an example in which the four parallel-connected n-channel transistors and the four parallel-connected p-channel transistors are formed on the same substrate.

As shown in FIG. 1(c), there is prepared a substrate having predetermined-thickness, (100) plane orientation, undoped silicon SOI (Silicon on Insulator) layers 14-n and 14-p, separated by a 200 nm-thickness buried oxide film 13, on a silicon support substrate 12.

Herein, the surface of each of the SOI layers 14-n and 14-p is preferably such that the channel length direction is a <110> direction. This is because the saturation current amount by the movement of holes on the (110) plane becomes maximum in the <110> direction. On the other hand, it is necessary to take into consideration that the crystal-direction dependence of the saturation current amount by the movement of electrons on the (100) plane is small.

An SOI layer is removed by etching at its portions other than the regions 14-n where the n-channel transistors will be formed and the regions 14-p where the p-channel transistors will be formed. As a result, the regions 14-n and 14-p are separately formed on the oxide film 13 (see FIG. 1(c)). The side surfaces of the separated regions are the (110) plane.

In order to remove unevenness on the side surfaces, caused by the etching process, of the regions 14-n where the n-channel transistors will be formed and of the regions 14-p where the p-channel transistors will be formed and to round corners, caused by the etching process, of the regions 14-n where the n-channel transistors will be formed and of the regions 14-p where the p-channel transistors will be formed, it is preferable to perform annealing in a hydrogen atmosphere at 800° C. or more.

In the illustrated example, the SOI layer may be common to both regions as an i layer or may be formed as a p-type and, later, the regions 14-p where the p-channel transistors will be formed may be converted to an n-type. In this event, threshold adjusting impurity implantation may be performed to carry out substrate concentration adjustment. For example, in the 100 nm generation, it is set to $4 \times 10^{18}$ cm$^{-3}$.

As shown in FIG. 1(b) and FIG. 1(c), cleaning is performed after the annealing process and, subsequently, oxidation is carried out using a microwave-excited plasma apparatus, thereby forming an SiO$_2$ gate insulating film 15 having a thickness of 1.6 nm on the upper surfaces and the side surfaces of the channel regions of the n-channel transistor regions 14-n and on the upper surfaces and the side surfaces (not shown' of the channel regions of the p-channel transistor regions 14-p. In this event, the thickness may be set to a value for obtaining a desired capacitance. As the gate insulating film 15, use may be made of a high permittivity material, such as Si$_3$N$_4$, a metal oxide such as HfO$_x$, ZrO$_x$, or La$_2$O$_3$, or a metal nitride such as Pr$_x$Si$_y$N$_z$.

Thereafter, undoped polycrystalline silicon is formed by a known low-pressure CVD method and then is etched to a desired gate length and width, thereby forming gate electrodes 16.

Then, $4 \times 10^{15}$ cm$^{-2}$ of arsenic is ion-implanted into source/drain regions 17 of the regions 14-n where the NMOS transistors will be formed and $4 \times 10^{15}$ cm$^{-2}$ of boron is ion-implanted into source/drain regions 18 of the regions where the PMOS transistors will be formed. In this event, $4 \times 10^{15}$ cm$^{-2}$ of arsenic in the case of the NMOS transistor and $4 \times 10^{15}$ cm$^{-2}$ of boron in the case of the PMOS transistor are also ion-implanted into the undoped polycrystalline silicon 16 self-alignedly formed by the known low-pressure CVD method. Thereafter, activation is carried out.

Thereafter, thin separation films 25 are formed for separation between the source/drain layers 17 of the NMOS transistor regions and the gate electrodes 16 of the NMOS transistor regions 14-n and for separation between the source/drain layers 18 of the PMOS transistor regions and the gate electrodes 16 of the PMOS transistor regions 14-p. For example, the thin separation films 25 can be formed by the following technique. After depositing SiO$_2$ to 45 nm or more by a known CVD method, small-damage anisotropic etching is used to remove the separation film 25 so that the thin separation films 25 are formed. In this event, Si$_3$N$_4$, SiON, or a laminated structure of SiO$_2$ and Si$_3$N$_4$ may be used as the thin separation film 25 in order to obtain desired heat resistance and electrical insulating property.

Thereafter, for forming a silicide layer 26, nickel is deposited by a small-damage sputtering method. In this event, for fully siliciding the polycrystalline silicon 16 on the NMOS transistor regions 14-n and the polycrystalline silicon 16 on the PMOS transistor regions 14-p in a subsequent annealing process, the nickel is deposited thicker than the polycrystalline silicon 16 on the NMOS transistor regions 14-n and the polycrystalline silicon 16 on the PMOS transistor regions 14-p. In this event, for obtaining a desired electrical resistance, titanium, cobalt, or tantalum may be used as a metal for forming the silicide layer 26.

Thereafter, annealing is carried out at 500° C. or more, thereby forming the silicide layer 26. Then, after the formation of the silicide layer 26, the nickel not reacted is removed by a known acid-based wet process. No interface reaction occurs between the nickel and the thin separation films 25 even by carrying out the annealing at 500° C. or more and thus no silicide is formed on the thin separation films 25, and therefore, by applying the known acid-based wet process, separation can be achieved self-alignedly between the source/drain layers 17 of the NMOS transistor regions and the gate electrodes 16 of the NMOS transistor regions 14-n and between the source-drain layers 18 of the PMOS transistor regions and the gate electrodes 16 of the PMOS transistor regions 14-p.

Further, an SiO$_2$ film is formed by CVD and, as shown in FIG. 1(c), gate lines 19, output lines 20, power supply lines 21, and power supply lines 22 are formed as wiring layers, so that inversion-mode PMOS transistors 100p and inversion-mode NMOS transistors 100n can be formed on the same substrate.

Herein, the total area of the upper surface and the side surfaces of the channel region of each n-channel transistor region 14-n and the total area of the upper surface and the side surfaces of the channel region of each p-channel transistor region 14-p are set equal to each other and, further, the operating speeds of both transistors are set equal to each other. Herein, the upper surface of the channel region of each of the n-channel transistor and the p-channel transistor is called a first region and the side surface of the channel region of each transistor is called a second region.

Specifically, the lengths L of the channel regions (i.e. source-drain distances) of both transistors 100p and 100n are set equal to each other, the width (distance in a direction crossing the length direction) of the upper surface of the channel region of the n-channel transistor region 14-n is given by Wn, and the height of the side surface thereof is given by Hn. On the other hand, the width of the upper surface of the channel region of the p-channel transistor region 14-p is given by Wp and the height of the side surface thereof is given by Hp.

Herein, the width Wn of the upper surface of the n-channel transistor region 14-n and the width Wp of the upper surface of the p-channel transistor region 14-p should always be set to 1/1.5 or less of the respective lengths L of the channel regions of both transistors 100p and 100n.

Herein, the reason that the width Wn of the upper surface of the n-channel transistor region 14-n and the width Wp of the upper surface of the p-channel transistor region 14-p should always be set to 1/1.5 or less of the respective lengths L of the channel regions of both transistors 100p and 100n is to utilize the quantum effect to thereby make the effective mass of carriers in both transistors 100p and 100n lightest and to suppress the leakage current due to the short-channel effect.

Accordingly, by setting the lengths L of the channel regions of both transistors 100p and 100n to a predetermined value, the width Wn of the upper surface of the n-channel transistor region 14-n and the width Wp of the upper surface of the p-channel transistor region 14-p are uniquely set to a predetermined value.

Taking the above points into consideration, conditions are derived under which the total area of the upper surface and the side surfaces of the channel region of the n-channel transistor region 14-n and the total area of the upper surface and the side surfaces of the channel region of the p-channel transistor region 14-p are equal to each other and, further, the operating speeds of both transistors are equal to each other.

At first, the height of the side surface of the n-channel transistor region 14-n is given by Hn, the height of the side surface of the channel region of the p-channel transistor region 14-p is given by Hp, and the height Hn of the side surface of the n-channel transistor region 14-n and the height Hp of the side surface of the channel region of the p-channel transistor region 14-p are set to a predetermined value so that an actual effective electron mass mee of the NMOS transistor and an actual effective hole mass mhe of the PMOS transistor become equal to each other.

Herein, the actual effective electron mass mee of the NMOS transistor and the actual effective hole mass mhe of the PMOS transistor can be expressed by the following formulas (1) and (2).

$$mee=(me1^{-1}\times We/(2\times He+We)+2\times me2^{-1}\times He/(2\times He+We))^{-1} \quad (1)$$

$$mhe=(mh1^{-1}\times Wh/(2\times Hh+Wh)+2\times mh2^{-1}\times Hh/(2\times Hh+Wh))^{-1} \quad (2)$$

In the formula (1), me1 represents an effective mass of electrons at the upper surface of the channel region of the n-channel transistor region 14-$n$ and me2 represents an effective mass of electrons at the side surface of the channel region of the n-channel transistor region 14-$n$.

Further, in the formula (2), mh1 represents an effective mass of holes at the upper surface of the channel region of the p-channel transistor region 14-$p$ and mh2 represents an effective mass of holes at the side surface of the channel region of the p-channel transistor region 14-$p$.

In the formulas (1) and (2), me1, me2 and mh1, mh2 are physical constants and thus invariable values.

By equalizing the actual effective electron mass mee of the NMOS transistor and the actual effective hole mass mhe of the PMOS transistor, the velocities of holes and electrons that travel in the channel regions of both transistors 100$p$ and 100$n$ are matched when the length L of the channel region of each of the transistors 100$p$ and 100$n$ is 45 nm or less. This is because when the length L of the channel region of each of the transistors 100$p$ and 100$n$ is 45 nm or less, the conduction mechanism by the quasi-ballistic effect is dominant. (Reference Document 1).

Reference Document 1 G. Gildenblat, J. Appl. Phys., Vol. 91, pp. 9883-9886, 2002

A velocity VQB of holes or electrons traveling in the channel region of the transistor 100$p$ or 100$n$ according to the conduction mechanism by the quasi-ballistic effect can be calculated by a formula (3).

$$VQB=2\times kB\times T/\pi/M \quad (3)$$

In the formula (3), kB represents the Boltzmann constant, T an absolute temperature, and M an actual effective mass of traveling carriers. That is, in this embodiment 1, M represents the actual effective electron mass mee of the NMOS transistor or the actual effective hole mass mhe of the PMOS transistor.

According to the relationship of a formula (4) representing the Ohm's law, if the length L of the channel region of each of the transistors 100$p$ and 100$n$ is 45 nm or less and the channel region traveling velocity of electrons of the NMOS transistor and the channel region traveling velocity of holes of the PMOS transistor are equal to each other, the conductivities per unit area, i.e. the mutual conductances of both transistors 100$p$ and 100$n$, become equal to each other. That is, by equalizing the actual effective electron mass mee of the NMOS transistor and the actual effective hole mass mhe of the PMOS transistor, the mutual conductances of both transistors 100$n$ and 100$p$ are matched so that the current driving capabilities of both transistors and thus the operating speeds thereof can be made substantially equal to each other with the same channel area and the same gate area, so that a fully balanced CMOS can be obtained.

$$\sigma=q\times N\times V \quad (4)$$

In the formula (4), q represents an electron charge quantity, N a charge density, and V a charge traveling velocity. N represents a charge density under an inversion layer in the case of a transistor and V represents an electron traveling velocity in the case of an NMOS transistor and a hole traveling velocity in the case of a PMOS transistor.

Under these conditions, in the embodiment 1 shown in FIG. 1, for example, Wn and Wp are set to 20 nm and Hn and Hp are set to 60 nm. In the illustrated embodiment 1, the channel lengths L are set to 32 nm in both transistors.

Figure 2:
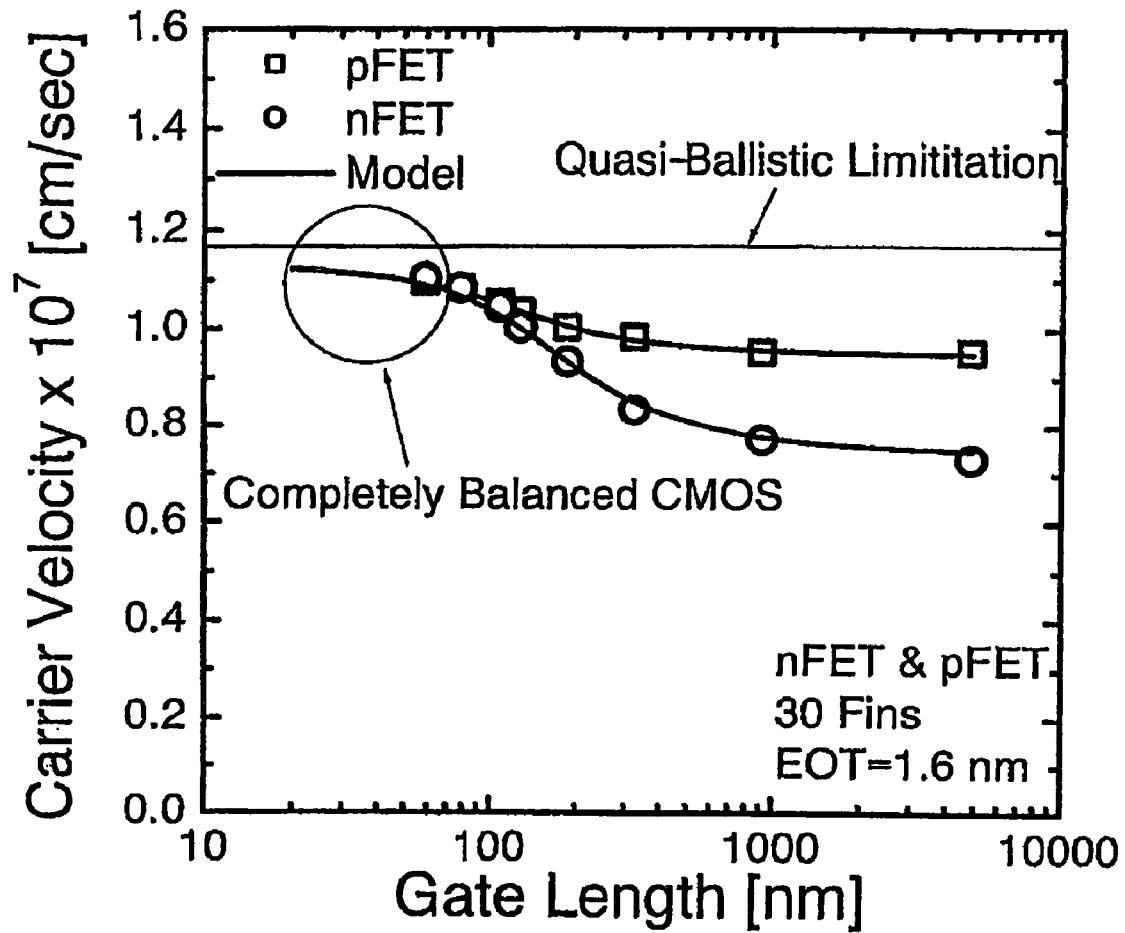
FIG. 2 is a graph showing the carrier traveling velocities of NMOS transistors and PMOS transistors of the semiconductor device according to the first embodiment of this invention, wherein the axis of abscissas represents the gate length.

FIG. 2 shows the channel region traveling velocity of electrons of NMOS transistors and the channel region traveling velocity of holes of PMOS transistors, wherein the gate length is changed from 5000 nm to 60 nm. When the length of a channel region is 45 nm or less, the channel region traveling velocity of electrons of the NMOS transistor and the channel region traveling velocity of holes of the NMOS transistor are equal to each other by the quasi-ballistic effect so that a fully balanced CMOS is obtained.

Figure 3A:
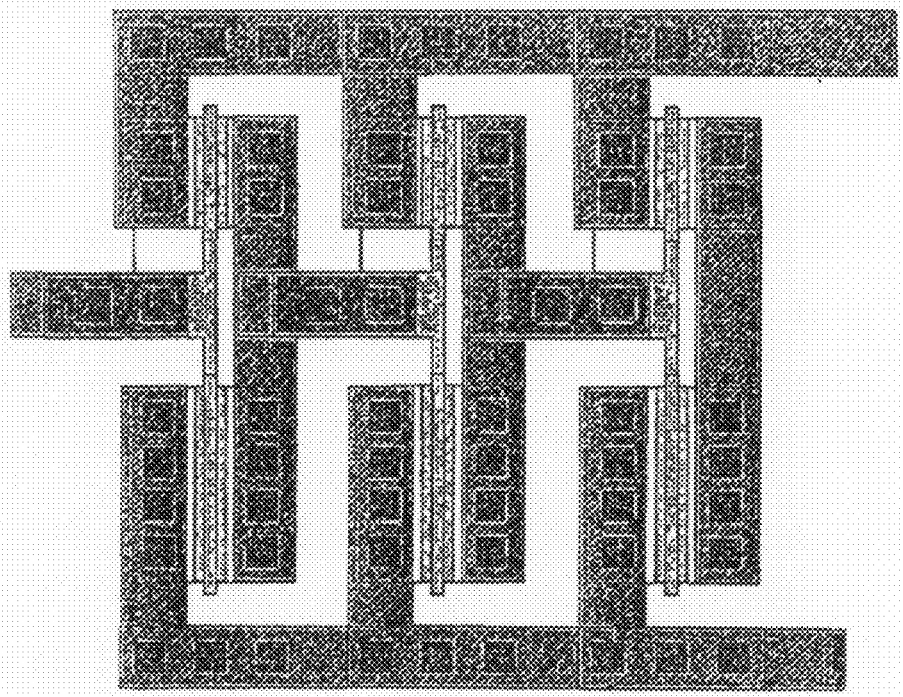
FIG. 3 is diagrams in each of which a semiconductor device is disposed on an SOI substrate, wherein (a) is a diagram in which the semiconductor device manufactured by the conventional technique is disposed on the SOI substrate and (b) is a diagram in which the semiconductor device according to the first embodiment of this invention is disposed on the SOI substrate.
Figure 3B:
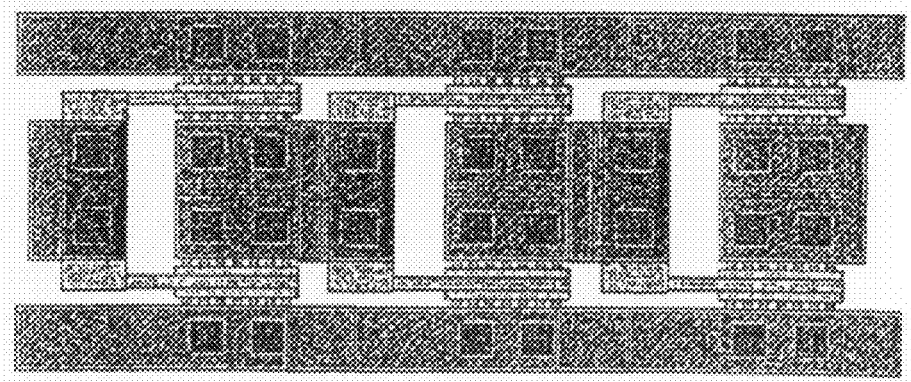
Figure 12B:
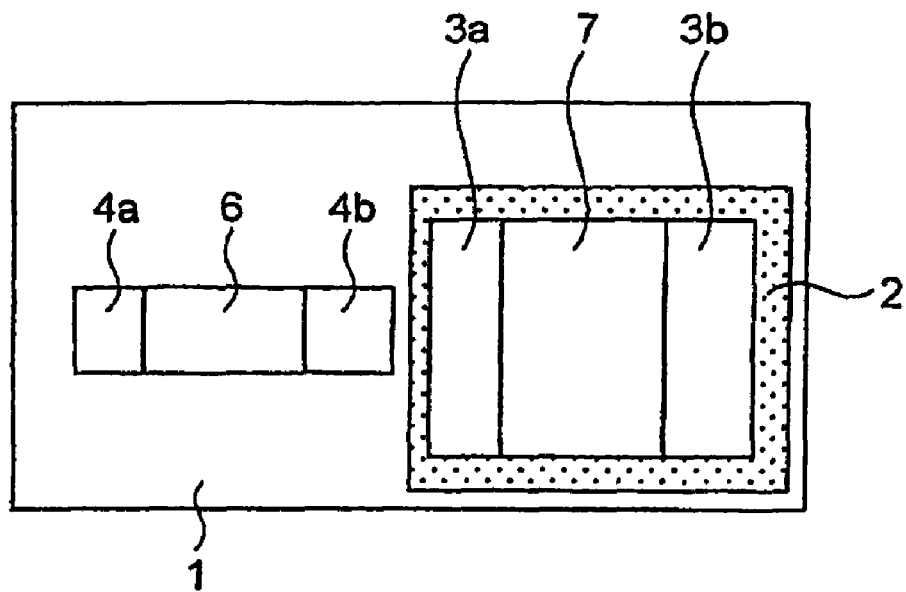
FIGS. 12(a) and (b) are a sectional view and a plan view of a conventional semiconductor device, respectively.

FIGS. 3($a$) and ($b$) show examples in which three-stage inverter gates are formed by the conventional example of FIG. 12 and the fully balanced CMOSs according to this invention, respectively, and are each actually disposed on an SOI substrate so that an output of the first stage is connected to an input of the second stage and an output of the second stage is connected to an input of the third stage. An area required for disposing the fully balanced CMOSs on the SOI substrate as shown in FIG. 3($b$) can be half an area required for disposing the conventional example of FIG. 12 on the SOI substrate and the speed can be increased by about one digit.

Figure 4:
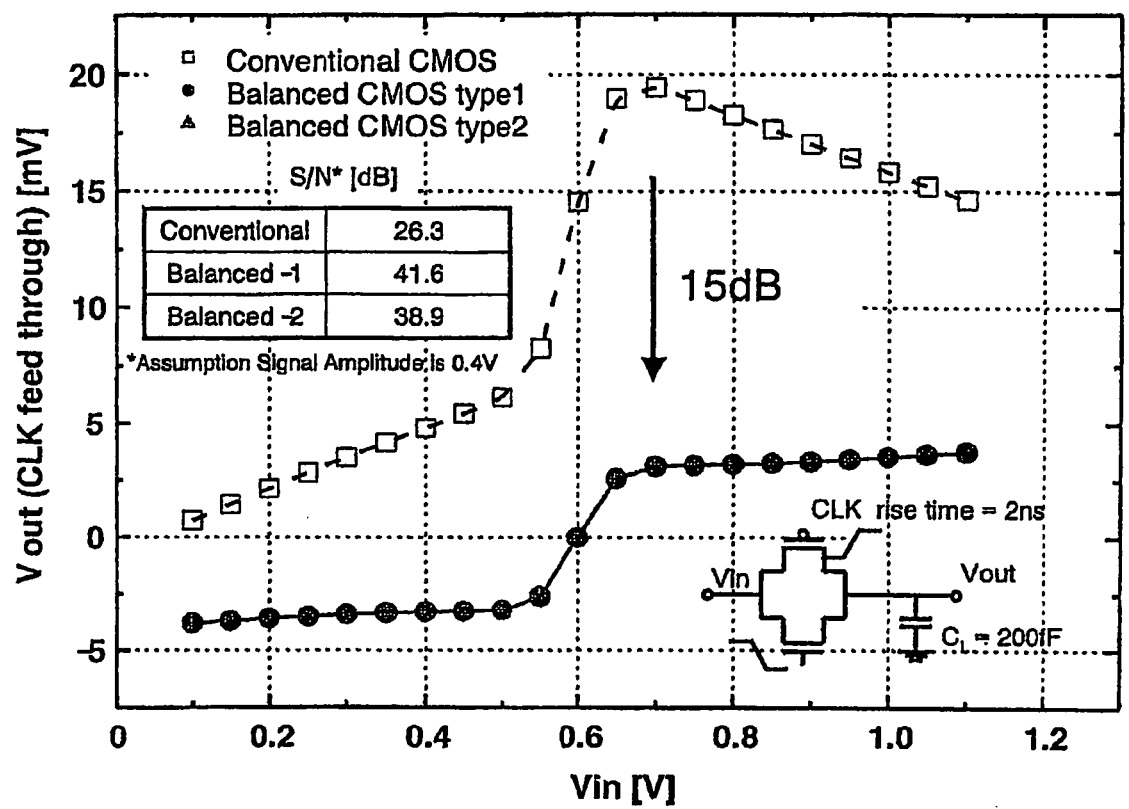
FIG. 4 is a graph showing an improvement in offset noise when analog switches are formed by a normal C-MOS circuit and the C-MOS circuit according to the first embodiment of this invention, respectively.

Further, in the semiconductor device according to the embodiment 1 of this invention, by equalizing the gate sizes/areas of both p- and n-transistors, the gate capacitances and the parasitic capacitances of both transistors become equal to each other, so that, as shown in FIG. 4, the offset noise of an analog switch formed by these transistors can be reduced by as much as 15 dB. Herein, in the embodiment 1 shown in FIG. 1($c$), the inversion-mode (inversion type) transistors are used as both the PMOS and NMOS transistors.

Other Embodiments

Figure 5A:
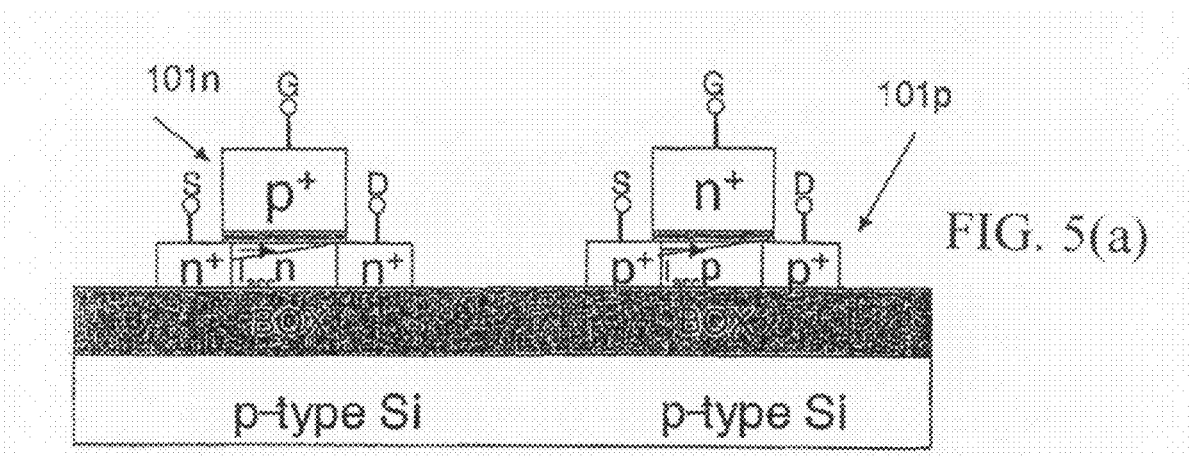
FIG. 5(a), FIG. 5(b), and FIG. 5(c) are sectional views exemplarily showing main portions of second, third, and fourth embodiments of this invention, respectively.
Figure 5B:
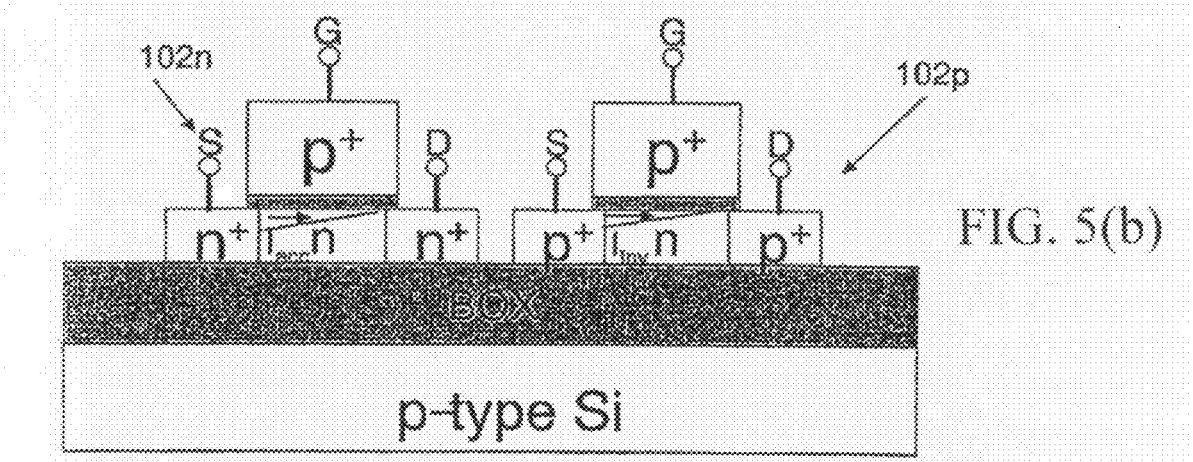
Figure 5C:
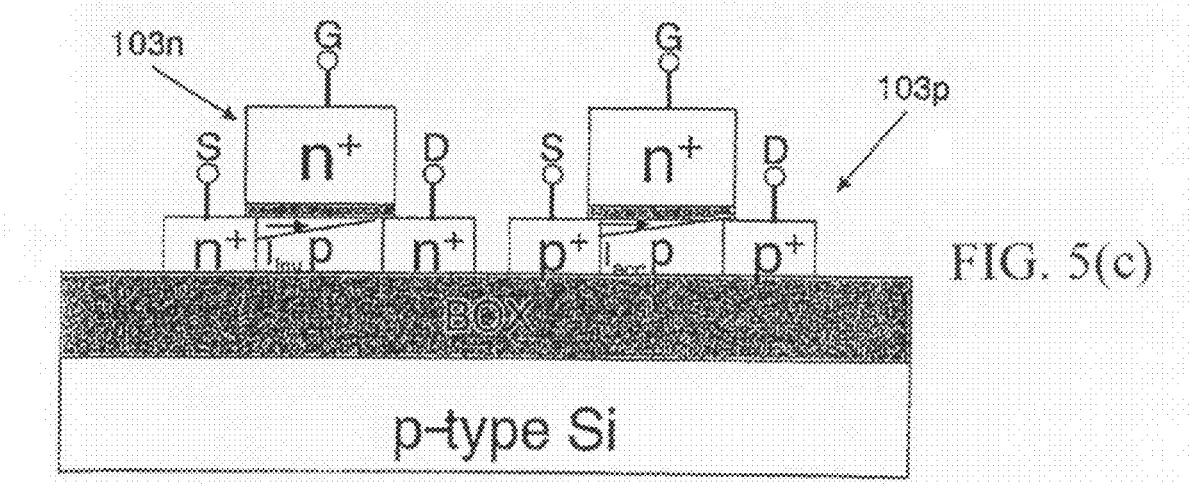

FIG. 5($a$), ($b$), and ($c$) show second, third, and fourth embodiments, respectively, and are sectional views in the direction corresponding to FIG. 1($c$) in the first embodiment.

FIG. 5($a$) shows an example in which an n-channel transistor (i.e. an NMOS transistor) 101$n$ and a p-channel transistor (i.e. a PMOS transistor) 101$p$ are each of the accumulation mode (accumulation type).

FIG. 5($b$) shows an example in which an n-channel transistor (i.e. an NMOS transistor) 102$n$ is of the accumulation mode and a p-channel transistor (PMOS transistor) 102$p$ is of the inversion mode. Since the structure of FIG. 5($b$) is formed by wells (n-wells) of the same conductivity type and gate electrodes of the same conductivity type ($p^+$-type), there is an advantage in that the process is simplified. Further, using the accumulation-mode n-channel transistor, the 1/f noise of the entire CMOS can be reduced.

Figure 11:
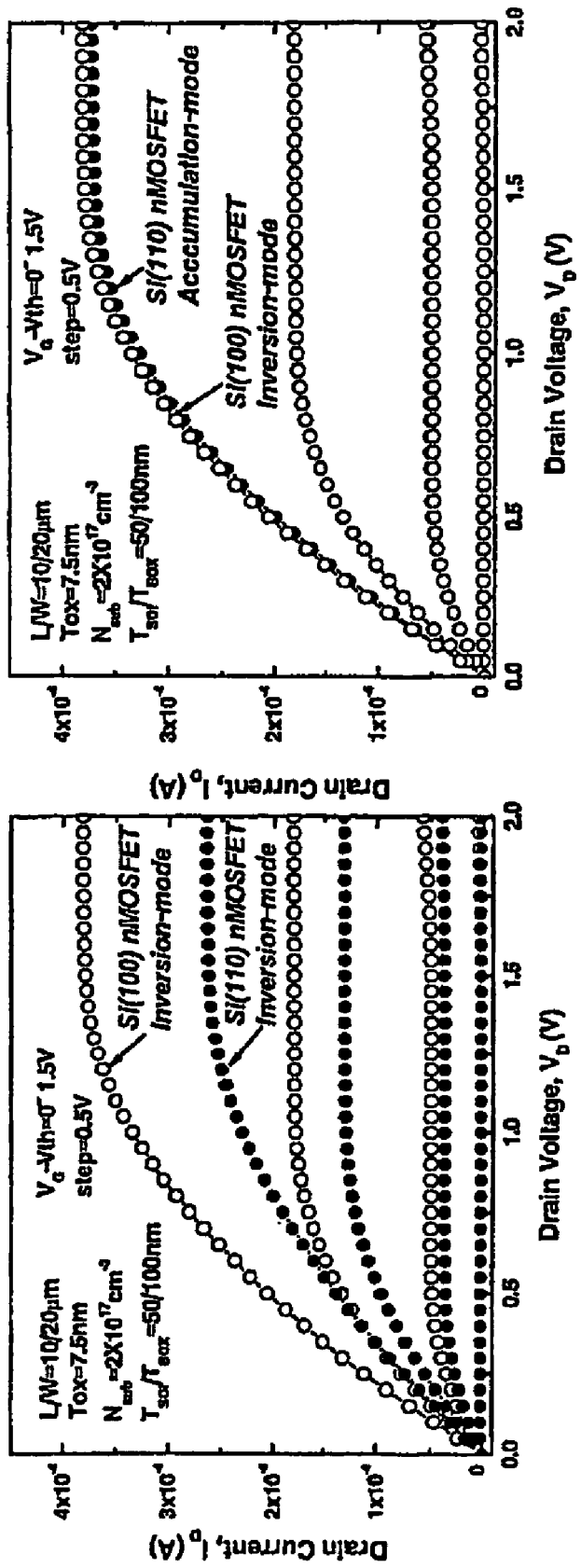
FIG. 11 is a graph showing the drain voltage-drain current characteristics of an accumulation-mode transistor according to this invention and a normal transistor.

Further, FIG. 5($c$) shows an example in which an n-channel transistor (NMOS transistor) 103$n$ is of the inversion mode and a p-channel transistor (PMOS transistor) 103$p$ is of the accumulation mode. Since the structure of this example is formed by wells (p-wells) of the same conductivity type and gate electrodes of the same conductivity type ($n^+$-type), there is an advantage in that the process is simplified. Further, since only the $n^+$-type polysilicon gate electrodes are used, it is possible to prevent diffusion of boron caused by film thickness reduction (boron tends to diffuse into a gate oxide film and thus there occurs a phenomenon that the interface mobility of carriers is degraded). As will be described later, there is also an advantage in that, using the accumulation-mode transistor, the current driving capability increases as compared with the inversion-mode transistor (FIG. 11).

Herein, referring to FIGS. 5 to 11, the accumulation-mode transistor according to this invention will be described using the n-channel transistors (NMOS transistors) 101n and 102n of FIGS. 5(a) and (b) as examples.

Figure 6A:
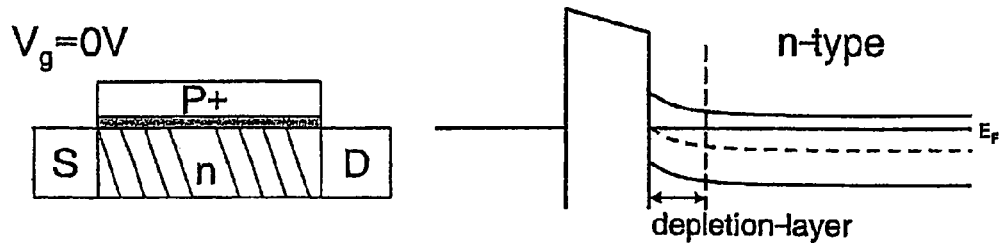
FIG. 6(a), FIG. 6(b), FIG. 6(c), and FIG. 6(d) are diagrams for explaining the operating principle of an accumulation-mode n-MOS transistor used in the embodiments 2 and 3 of this invention.
Figure 6B:
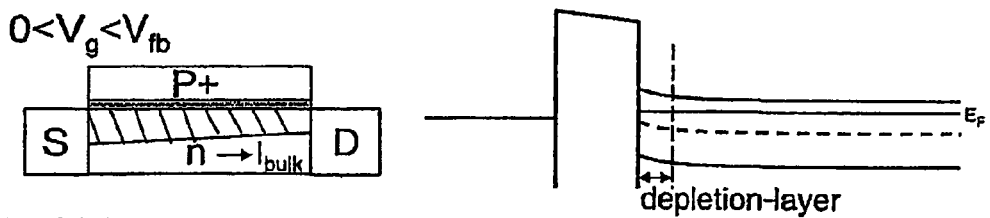
Figure 6C:
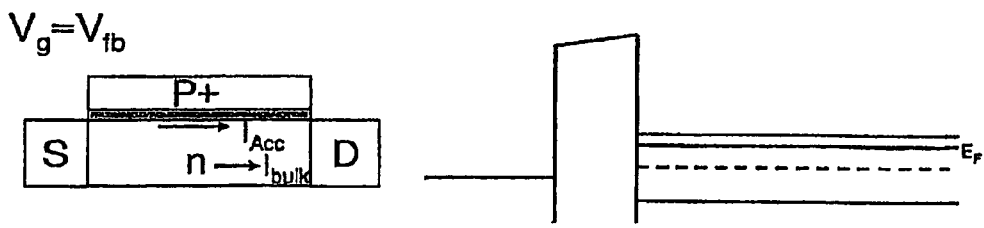
Figure 6D:
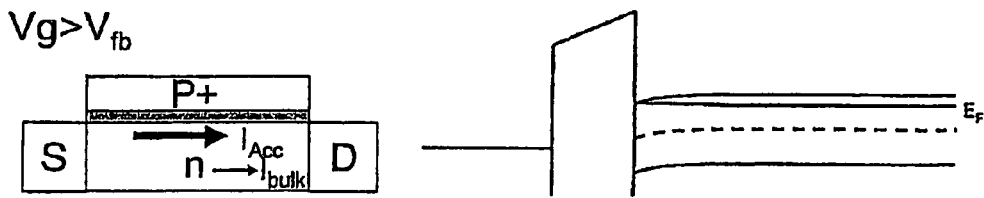

FIG. 6(a) to (d) show the operating principle of the accumulation-mode n-channel transistor (NMOS transistor). At first, as shown in FIG. 6(a), when a gate voltage Vg is zero, a depletion layer extends over the entire SOI layer. As shown in FIG. 6(b), when the gate voltage Vg is applied, the depletion layer retreats to the upper surface of the channel and a bulk current Ibulk flows. Subsequently, when the gate voltage increases, an accumulated current Iacc also flows as shown in FIGS. 6(c) and (d).

This phenomenon will be explained using FIGS. 7(a) and (b). By employing the SOI structure and setting the width of a depletion layer formed by a work function difference between the gate electrode and the SOI layer to be greater than the thickness of the SOI layer, it is possible to obtain an accumulation-structure normally-off type MOS transistor as shown in FIG. 7(a). Herein, using $p^+$-polysilicon (work function 5.2 eV) as the gate electrode in the n-channel transistor as illustrated and using $n^+$-polysilicon (work function 4.1 eV) as the gate electrode in the p-channel transistor, it is possible to provide a work function difference with respect to the SOI layer.

As shown in FIG. 11, by forming an accumulation-structure n-channel transistor on the silicon (110) plane, it is possible to realize the current driving capability equal to that of a normal n-channel transistor formed on the silicon (100) plane. Further, by forming an accumulation-structure p-channel transistor on the silicon (110) plane, it is possible to realize the current driving capability that is 2.5 times as much as that of a p-channel transistor formed on the silicon (100) plane.

Figure 8:
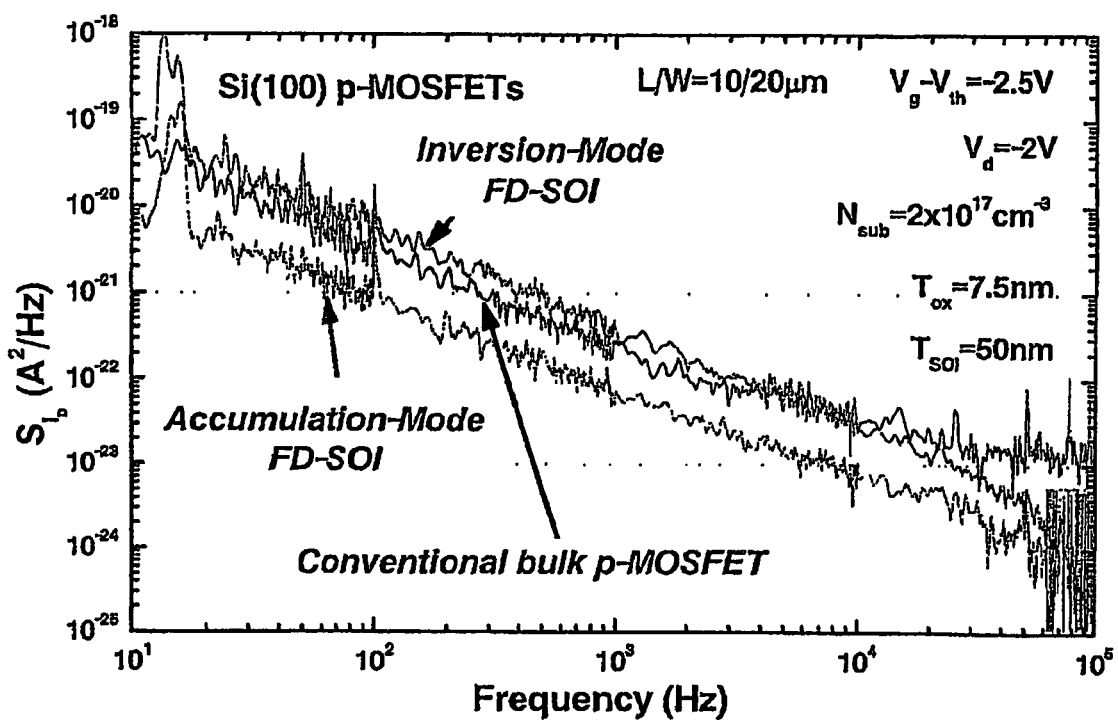
FIG. 8 is a graph showing 1/f noise of an accumulation-mode transistor according to this invention.

Further, as shown in FIG. 8, the 1/f noise is also reduced in the accumulation mode.

The accumulation-mode device of this invention does not realize normally-off by a pn junction barrier, but becomes normally off if the work function difference between the gate electrode and the SOI layer, the thickness of the SOI layer, the drain voltage, and the source-drain distance are optimized so that a depletion layer is present to form a barrier between the source and the drain when the gate voltage is 0V as shown in FIG. 7(a).

As shown in FIG. 7(b), since a channel is formed in an accumulation layer when the device is on, a vertical electric field of the channel region becomes smaller as compared with an inversion-mode MOS transistor that forms a normal inversion layer and, thus, it is possible to increase the effective mobility. Therefore, even if the impurity concentration in the SOI layer increases, degradation of the mobility does not occur. Further, since the current flows not only in the accumulation layer but also in the entire SOI layer (bulk portion) when the device is on, it is possible to increase the current driving capability as the impurity concentration in the SOI layer becomes higher.

As compared with a normal MOS transistor in which, following the miniaturization, the channel mobility is degraded as the impurity concentration in a channel region increases, the accumulation-mode device of this invention is very advantageous for the miniaturization. In order to increase the current driving capability as much as possible and realize normally-off while providing punch-through resistance to the miniaturization, it is preferable to use a gate electrode with a work function as large as possible in an accumulation-mode n-channel transistor and a gate electrode with a work function as small as possible in an accumulation-mode p-channel transistor.

In the accumulation-mode device of this invention, a depletion layer is formed in the SOI layer by increasing a work function difference between the gate electrode material and the SOI layer as described above so that an electric field in the channel direction caused by a voltage applied to the drain electrode does not affect an end of the source, thereby achieving the punch-through resistance. The current driving capability increases as the thickness of the SOI layer becomes greater, but an electric field from the gate generated by the work function difference hardly exerts an influence to the lower end (bottom surface) of the SOI layer. Therefore, the most important factor in the accumulation-mode device of this invention is to increase the work function difference.

Figure 9A:
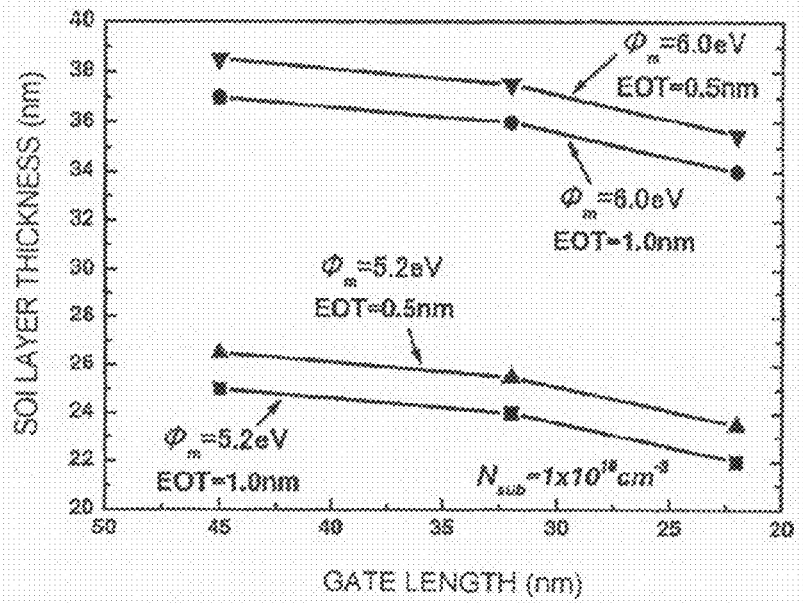
FIG. 9(a) is a graph showing the relationship between the gate length and the thickness of an SOI layer when an accumulation-mode n-MOS used in this invention becomes normally off, wherein parameters are a work function of a gate electrode and an EOT (equivalent oxide film thickness)

FIG. 9(a) shows the thickness of an SOI layer that is allowed (normally-off is achieved) when use is made of a gate electrode with a work function of 5.2 eV or 6.0 eV in each accumulation-mode n-channel transistor. There are shown cases with gate insulating films of 0.5 nm and 1.0 nm in EOT, respectively. The thickness of the SOI layer allowed for achieving normally-off in each miniaturization generation (gate length) increases as the work function becomes larger and, in the 22 nm generation, the thickness becomes about twice in the case of 6.0 eV as compared with that in the case of 5.2 eV.

Figure 9B:
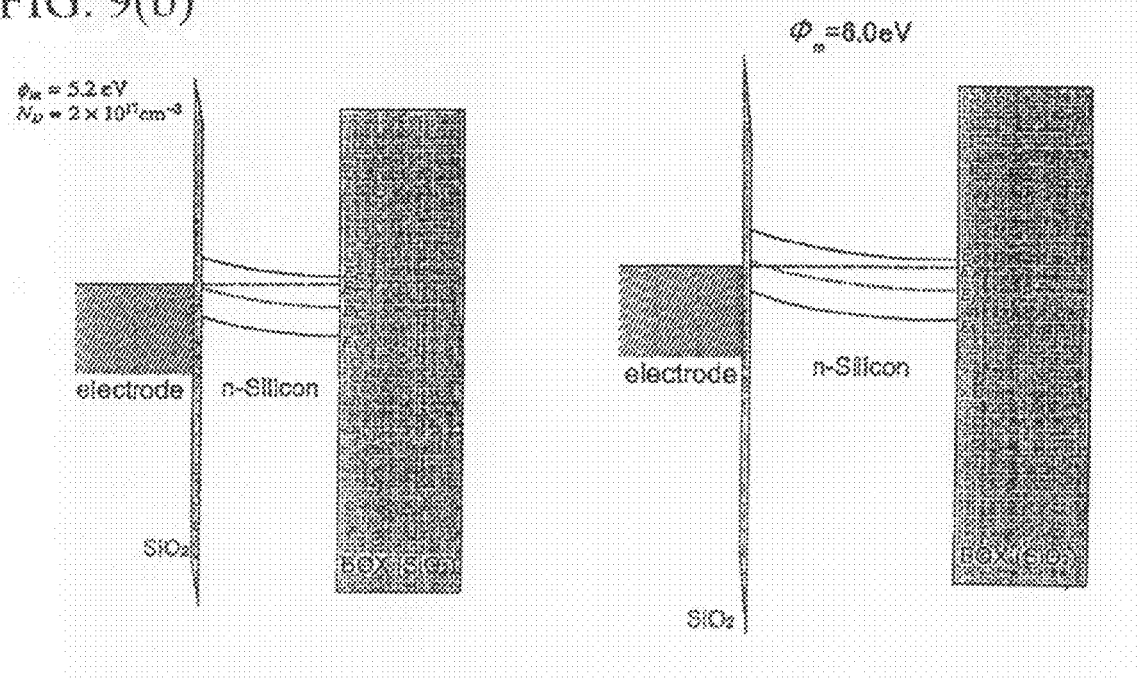
FIG. 9(b) shows the band structures when the work functions of gate electrode materials are 5.2 eV and 6.0 eV, respectively.

FIG. 9(b) shows band diagrams when the gate electrodes with the work functions of 5.2 eV and 6.0 eV are used (insulating film thickness 1 nm). As shown in the diagrams, as the work function increases, the SOI layer can be thicker and the current driving capability increases.

Figure 10:
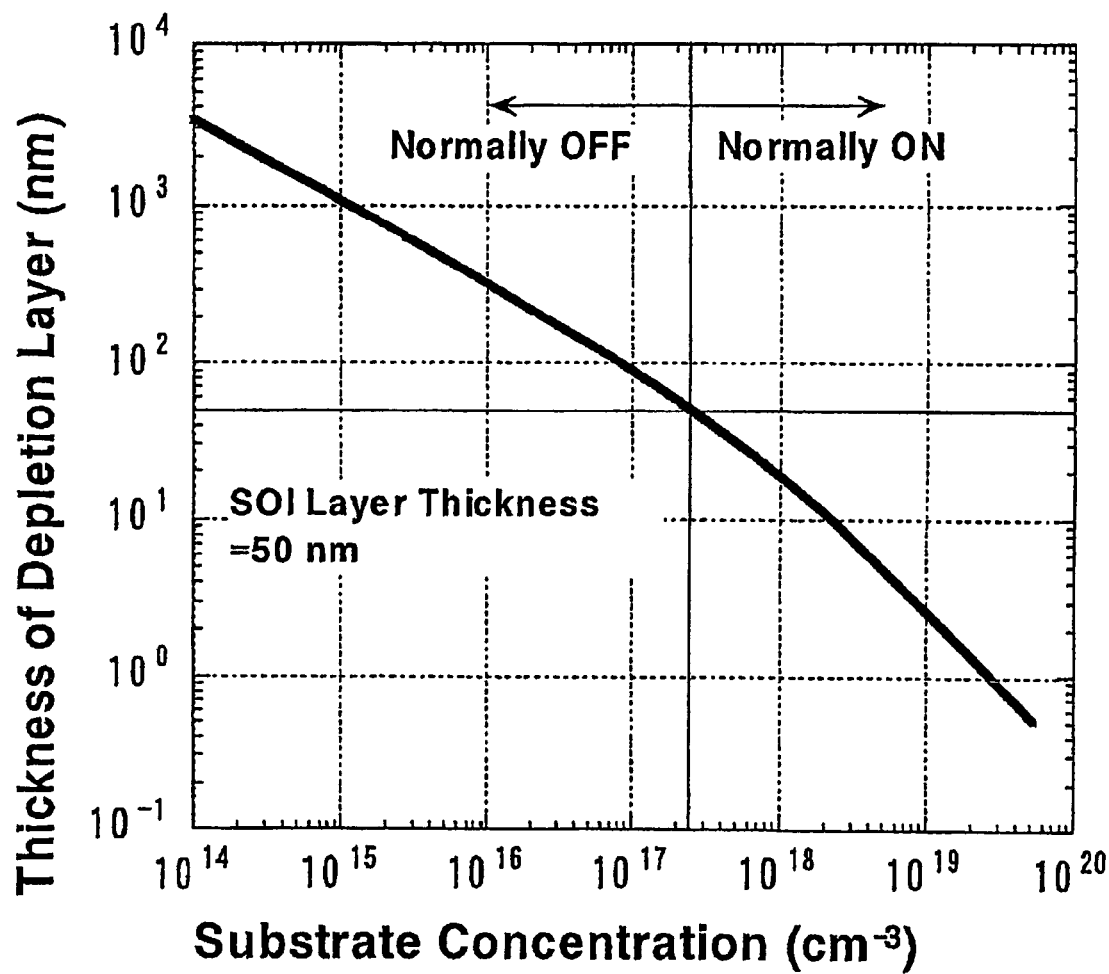
FIG. 10 is a graph showing the relationship between the depletion layer thickness and the substrate impurity concentration in an accumulation-mode transistor according to the embodiment of this invention.

FIG. 10 shows a correlation diagram of the depletion layer thickness and the substrate impurity concentration. Referring to this figure, in the accumulation-mode n-channel transistor 102n, 103n of this invention, when the gate electrode 16 is formed of $P^+$-polycrystalline silicon, since its work function is approximately 5.15 eV and a work function of the $10^{17}$ $cm^{-3}$ n-type silicon layer 14n of the substrate is approximately 4.25 eV, a work function difference of approximately 0.9 eV occurs. In this event, since the thickness of a depletion layer is about 90 nm, the SOI layer is fully depleted even if Hn and Hp are set to 60 nm and Wn and Wp are set to 20 nm. Herein, the substrate impurity concentration and the SOI film thickness can be selected in a range where the SOI film thickness is smaller than the depletion layer thickness. As a gate electrode material, use can be made, instead of the polycrystalline silicon, of W, Pt, Ni, Ge, Ru, or its silicide if the SOI layer is fully depleted in consideration of a work function difference.

In the CMOS structure of this invention, the SOI layer preferably has a plane orientation inclined within ±10° from the (100) plane and the thickness of the SOI layer is set smaller than that of a depletion layer caused by a work function difference between the gate electrode and the SOI layer in the accumulation-mode transistor. With this configuration, the current driving capability is improved so that the NMOS transistor and the PMOS transistor are balanced to have substantially the same current driving capability. Further, by forming the NMOS transistor and the PMOS transistor on the same semiconductor substrate, there is also an advantage in that the area corresponding to insulation isolation can be reduced. By balancing the NMOS transistor and the PMOS transistor so as to have substantially the same current driving capability in this manner, there is obtained a semiconductor device that can increase the integration degree.

In the foregoing description of FIGS. 5 to 11, the accumulation-mode transistor formed in the SOI layer has been described. However, in the case where both n- and p-transistors are the inversion-mode transistors like in FIG. 1, the transistors are not necessarily formed in the SOI layers, but may be directly formed on the silicon substrate. That is, both transistor layers may be formed by etching the surface of the silicon substrate or may be formed by forming a desired semiconductor layer on the silicon substrate and then etching the semiconductor layer.

In the embodiments, the description has been given of the case where the surface of each transistor region is the (100) plane and the side surfaces thereof are the (110) plane. However, this invention is by no means limited thereto. The surface may be a plane within ±10 from the (100) plane and the side surfaces may be a plane within ±10 from the (110) plane. This invention is equally applicable to the case where the surface is the (110) plane or a plane within ±10° from the (110) plane and the side surfaces are the (100) plane or a plane within ±10° from the (100) plane. In this case, the width of each transistor region increases and thus the plane area increases.

Figure 13:
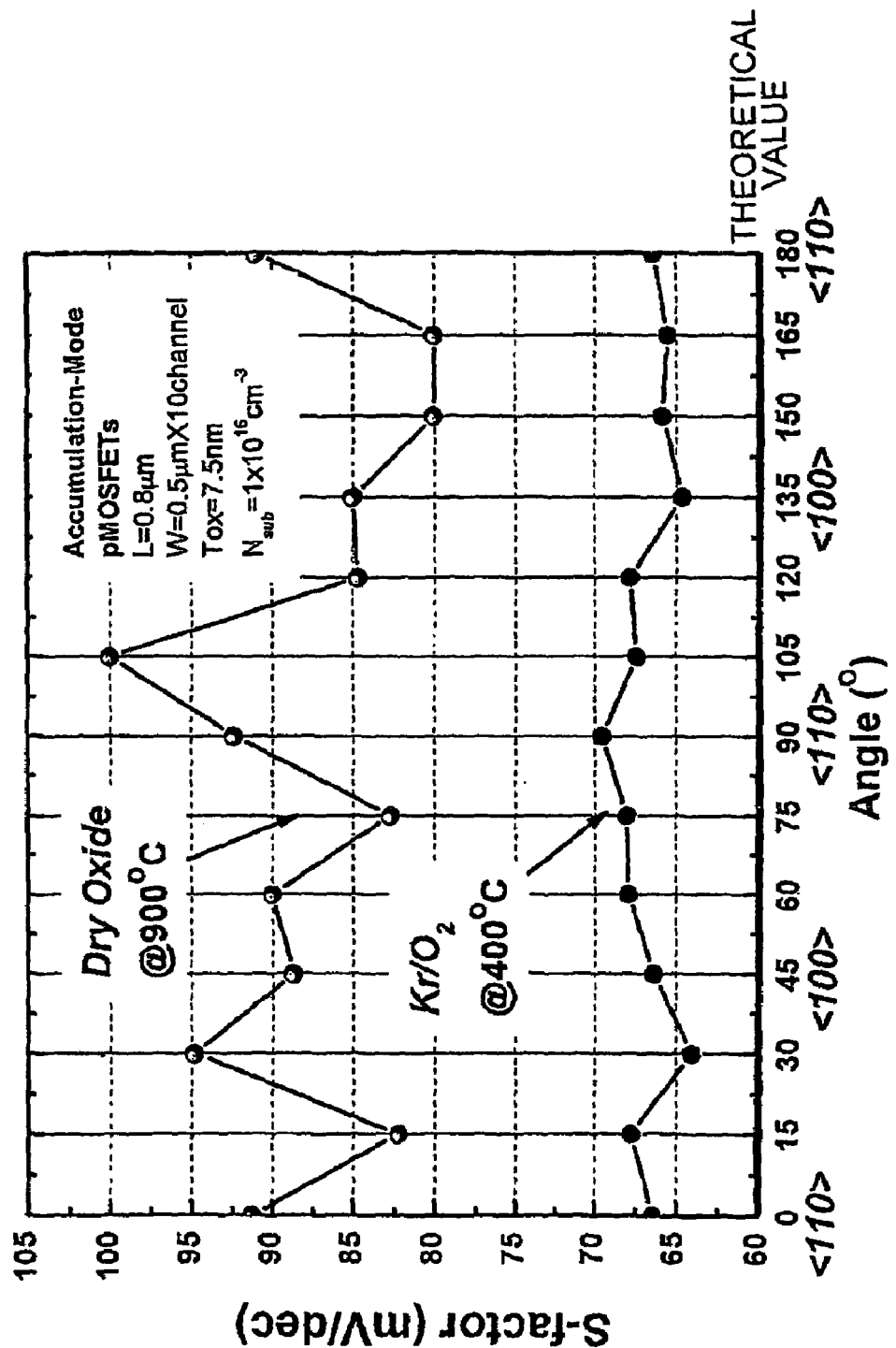
FIG. 13 is a graph, relating to this invention, showing S-factors according to channel orientations in the case where a gate insulating film is formed by thermal oxidation and in the case where a gate insulating film is formed by radical oxidation.
Figure 14A:
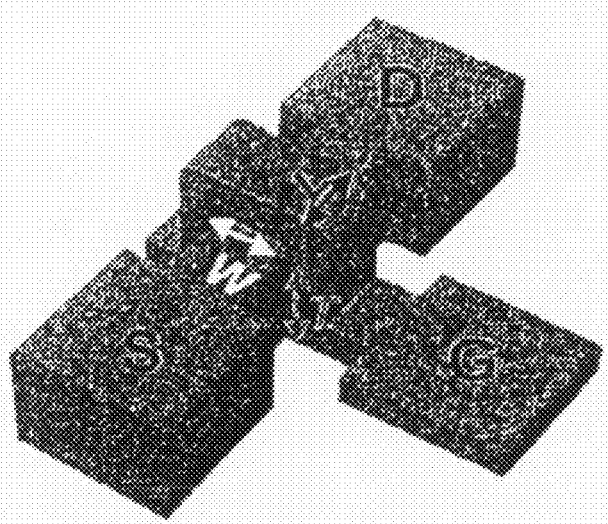
FIG. 14 relates to this invention, wherein (a) is a perspective view of a device structure of an accumulation-mode three-dimensional p-channel MOS transistor and (b) shows orientations thereof.
Figure 14B:
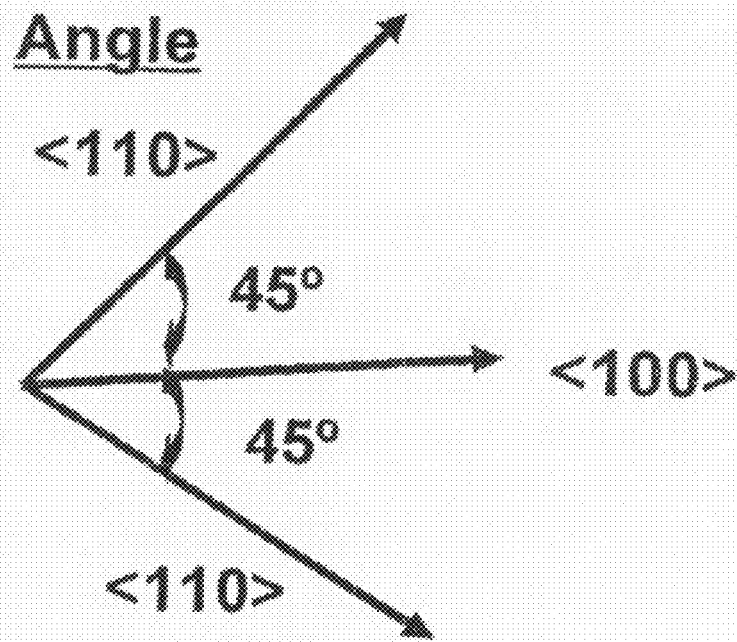

It is preferable that the gate insulating film of the semiconductor device of this invention be formed by radical oxidation, radical nitriding, or radical oxynitriding using a microwave-excited high-density plasma apparatus, which will be explained using FIGS. 13 and 14. FIG. 13 is a graph showing S-factors according to channel orientations in the case where a gate insulating film is formed by thermal oxidation and in the case where a gate insulating film is formed by radical oxidation. Measurement was carried out using, as devices, accumulation-mode three-dimensional p-channel MOS transistors as shown in FIG. 14(a). The surface of a channel region is the (100) plane and its orientation is a <110> direction. Data of the channel region are as described in FIG. 13. When the crystal plane of the surface of the channel region is the (100) plane and its crystal orientation is the <110> direction, since the same crystal plane appears on the side surfaces of the channel region, the crystal plane of the side surfaces of the channel region in this case is the (110) plane. As shown in FIG. 14(b), when the orientation of the channel surface is rotated by 45° from a <110> direction, it becomes a <100> direction. FIG. 13 shows an S-factor at every 150 when the orientation was rotated by 180° in this manner. The S-factor represents a gate voltage required for increasing the drain current 10 times and thus is better as it is smaller, wherein the theoretical value is 60 mV/dec. As shown in FIG. 13, it is seen that when a gate insulating film is formed by thermal oxidation (900° C. dry atmosphere), the S-factor is 80 to 100 mV/dec which is 1.3 to 1.7 times as much as the theoretical value and, further, variation is large depending on the crystal plane orientation, while, in the case of radical oxidation (oxidation at 400° C. with a plasma of Kr and oxygen), the S-factor is 64 to 69 mV/dec which is only 1.06 to 1.15 times au much as the theoretical value, thus extremely excellent as compared with the conventional thermal oxide film. It has been confirmed that this also applies to the case where a gate insulating film is formed by radical nitriding or radical oxynitriding.

INDUSTRIAL APPLICABILITY

While this invention has been concretely described based on the embodiments, it is needless to say that this invention is not limited thereto, but can be variously changed within a range not departing from the gist of the invention. For example, this invention is not only applicable as an inverter circuit to a logic circuit, but also applicable to other electronic circuits.

The invention claimed is:

1. A semiconductor device comprising a circuit having at least a pair of transistors of different conductivity types, wherein a transistor of one conductivity type is formed using a first semiconductor layer provided on an SOI substrate and a first gate insulating layer covering at least part of a surface of said first semiconductor layer, a transistor of another conductivity type is formed using a second semiconductor layer provided on said SOI substrate and a second gate insulating layer covering at least part of a surface of said second semiconductor layer, a surface of a first region for forming a channel of said first semiconductor layer has a first crystal plane, a surface of a second region provided on a plane crossing the surface of said first region for forming a channel on a side of said first semiconductor layer has a second crystal plane different from said first crystal plane and adapted to provide a different mobility of carriers than said first crystal plane, a surface of a first region for forming a channel of said second semiconductor layer has a first crystal plane, a surface of a second region provided on a plane crossing the surface of said first region for forming a channel on a side of said first semiconductor layer has a second crystal plane different from said first crystal plane and adapted to provide a different mobility of carriers than said first crystal plane, and, given that an effective mass of electrons at the surface of said first region for forming the channel of said first semiconductor layer is me1, an effective mass of electrons at the surface of said second region is me2, an effective mass of holes at the surface of said first region for forming the channel of said second semiconductor layer is mh1, an effective mass of holes at the surface of said second region is mh2, a width of the surface of said first region for forming the channel of said first semiconductor layer is We, a width of the surface of said second region for forming the channel of said first semiconductor layer is He, a width of the surface of said second region for forming the channel of said second semiconductor layer is Wh, a width of the surface of said second region for forming the channel of said second semiconductor layer is Hh, a length of the surface of said first region for forming the channel of said first semiconductor layer is L1, and a length of the surface of said first region for forming the channel of said second semiconductor layer is L2, an actual effective electron mass mee of said first semiconductor layer and an actual effective hole mass mhe of said first semiconductor layer when L1, We, L2, and Wh are set to predetermined values are respectively expressed by $$mee=(me1^{-1} \times We/(2 \times He+We)+2 \times me2^{-1} \times He/(2 \times He+We))^{-1}$$

$$mhe=(mh1^{-1} \times Wh/(2 \times Hh+Wh)+2 \times mh2^{-1} \times Hh/(2 \times Hh+Wh))^{-1},$$

wherein He and Hh are determined so as to establish mee=mhe and to satisfy We=Wh and He=Hh, thereby configuring said transistor of one conductivity type and said transistor of another conductivity type so that areas of channel regions thereof are substantially equal or equivalent to each other and operating speeds thereof are substantially equal or equivalent to each other.

2. A semiconductor device according to claim 1, wherein, by setting said L1 and said L2 to be equal to each other, remaining He and Hh are determined so as to substantially satisfy We=Wh and to set We and Wh to a predetermined value so as to satisfy 1.5×L1>We and 1.5×L2>Wh by setting the lengths of the surfaces of said first regions to be 1.5 times or more longer than the widths of the surfaces of said first regions, respectively, and further to satisfy mee=mhe and He=Hh.

3. A semiconductor device according to claim 1, wherein said L1 and L2 are 45 nm or less.

4. A semiconductor device comprising a circuit having at least a pair of transistors of different conductivity types, wherein an n-channel transistor is formed using a first semiconductor layer provided on an SOI substrate and a first gate insulating layer covering at least part of a surface of said first semiconductor layer, a p-channel transistor is formed using a second semiconductor layer provided on said SOI substrate and a second gate insulating layer covering at least part of a surface of said second semiconductor layer, a surface of a first region for forming a channel of said first semiconductor layer has a (100) plane or a plane within ±10° from the (100) plane, a surface of a second region for forming a channel on a side of said first semiconductor layer has one or a plurality of planes adapted to provide a smaller mobility of electrons than the plane within ±10° from the (100) plane, a surface of a first region for forming a channel of said second semiconductor layer has a (100) plane or a plane within ±10° from the (100) plane, a surface of a second region for forming a channel on a side of said second semiconductor layer has one or a plurality of planes adapted to provide a greater mobility of holes than the plane within ±10° from the (100) plane, and widths, lengths, and heights of the surfaces of said first regions and widths, lengths, and heights of the surfaces of said second regions are determined so that the sum of an area of the surface of said first region and an area of the surface of said second region in said first semiconductor layer and the sum of an area of the surface of said first region and an area of the surface of said second region in said second semiconductor layer are substantially equal or equivalent to each other and, further, operating speeds of said n-channel transistor and said p-channel transistor are substantially equal or equivalent to each other.

5. A semiconductor device according to claim 4, wherein said n-channel transistor and said p-channel transistor are each normally off, said n-channel transistor is of an inversion mode or an accumulation mode, and said p-channel transistor is of the inversion mode or the accumulation mode.

6. A semiconductor device according to claim 5, wherein said n-channel transistor and said p-channel transistor are each of the accumulation mode.

7. A semiconductor device according to claim 6, wherein a material of a second gate electrode provided on said second gate insulating film and an impurity concentration in said second semiconductor layer are selected so that a thickness of a depletion layer formed in said second semiconductor layer by a work function difference between said second gate electrode and said second semiconductor layer becomes greater than that of said second semiconductor layer.

8. A semiconductor device according to claim 6, wherein a material of a first gate electrode provided on said first gate insulating film and an impurity concentration in said first semiconductor layer are selected so that a thickness of a depletion layer formed in said first semiconductor layer by a work function difference between said first gate electrode and said first semiconductor layer becomes greater than that of said first semiconductor layer.

9. A semiconductor device according to claim 4, wherein said first and second gate insulating films each contain at least one kind of $SiO_2$, $Si_3N_4$, a metal silicon alloy oxide film, and a metal silicon alloy nitride film formed by a microwave-excited plasma.

10. A semiconductor device according to claim 9, wherein said first and second gate insulating films are formed at a temperature of 600° C. or less.

11. A semiconductor device according to claim 4, wherein the lengths of the surfaces of said first regions and the lengths of the surfaces of said second regions, forming channel lengths, are determined so as to be equal to each other in said re-channel transistor and said p-channel transistor.

12. A semiconductor device according to claim 4 wherein the lengths of the surfaces of said first regions in said n-channel transistor and said p-channel transistor are always 1.5 times or more longer than the widths of the surfaces of said first regions, respectively.

13. A semiconductor device according to claim 5, wherein said n-channel transistor and said p-channel transistor are each of the inversion mode.

14. A semiconductor device according to claim 5, wherein said n-channel transistor is of the inversion mode and said p-channel transistor is of the accumulation mode.

15. A semiconductor device according to claim 5, wherein said n-channel transistor is of the accumulation mode and said p-channel transistor is of the inversion mode.

16. A semiconductor device according to claim 4, wherein said first regions and said second regions have a length of 45 nm or less.

17. A semiconductor device comprising a circuit having at least a pair of a first conductivity type channel transistor and a second conductivity type channel transistor, a second conductivity type different from a first conductivity type, wherein said first conductivity type channel transistor comprises a first semiconductor layer provided on an SOI substrate, a first gate insulating layer covering at least part of a surface of said first semiconductor layer, and a first gate electrode covering said first gate insulating layer, and said second conductivity type channel transistor comprises a second semiconductor layer provided on said SOI substrate, a second gate insulating layer covering at least part of a surface of said second semiconductor layer, and a second gate electrode covering said second gate insulating layer, and wherein a first region where a channel of said first semiconductor layer is formed has a first plane forming the surface of said first semiconductor layer and one or a plurality of second planes forming a predetermined angle with said first plane and adapted to provide a smaller mobility of carriers of said first conductivity type channel transistor than said first plane, a second region where a channel of said second semiconductor layer is formed has a first plane forming the surface of said second semiconductor layer and one or a plurality of second planes forming a predetermined angle with said first plane and adapted to provide a greater mobility of carriers of said second conductivity type channel transistor than said first plane, and a width, a length, and a height of a surface of said first region and a width, a length, and a height of a surface of said second region are set so that the sum of an area of said first plane of said first region and an area of said second plane of said first region in said first semiconductor layer is substantially equal to the sum of an area of said first plane of said second region and an area of said second plane of said second region in said second semiconductor layer and, further, operating speeds of said first conductivity type channel transistor and said second conductivity type channel transistor are substantially equal or equivalent to each other.

18. A semiconductor device according to claim 17, wherein said first conductivity type channel transistor is an NMOS transistor, said second conductivity type channel transistor is a PMOS transistor, said first plane of each of said first and second semiconductor layers is a (100) plane of silicon or a plane within ±10° from the (100) plane, and said second plane thereof is a (110) plane of silicon or a plane within ±10° from the (110) plane.

19. A semiconductor device according to claim 17, wherein said first plane of each of said first and second semiconductor layers is a (110) plane of silicon or a plane within ±10° from the (110) plane, said second plane thereof is a (100) plane of silicon or a plane within ±10° from the (100) plane, said first conductivity type channel transistor is a PMOS transistor, and said second conductivity type channel transistor is an NMOS transistor.

20. A semiconductor device according to claim 17, wherein said first conductivity type channel transistor and said second conductivity type channel transistor are each of an inversion mode.

21. A semiconductor device according to claim 17, wherein said first conductivity type channel transistor and said second conductivity type channel transistor are each of an accumulation mode.

22. A semiconductor device according to claim 17, wherein said first conductivity type channel transistor is of an inversion mode and said second conductivity type channel transistor is of an accumulation mode.

23. A semiconductor device according to claim 17, wherein a material of said second gate electrode provided on said second gate insulating film and an impurity concentration in said second semiconductor layer are selected so that a thickness of a depletion layer formed in said second semiconductor layer by a work function difference between said second gate electrode and said second semiconductor layer becomes greater than that of said second semiconductor layer.

24. A semiconductor device according to claim 17, wherein a material of said first gate electrode provided on said first gate insulating film and an impurity concentration in said first semiconductor layer are selected so that a thickness of a depletion layer formed in said first semiconductor layer by a work function difference between said first gate electrode and said first semiconductor layer becomes greater than that of said first semiconductor layer.

25. A semiconductor device according to claim 17, wherein the lengths of the surfaces of said first and second regions forming channel lengths of said first conductivity type channel transistor and said second conductivity type channel transistor, respectively, are set so as to be equal to each other.

26. A semiconductor device according to claim 17, wherein the lengths of the surfaces of said first and second regions forming channel lengths of said first conductivity type channel transistor and said second conductivity type channel transistor, respectively, are 1.5 times or more longer than the widths of the surfaces of said first and second regions, respectively.

27. A semiconductor device according to claim 17, wherein said channel of said first semiconductor region has a length of 45 nm or less, and said channel of said second semiconductor layer has a length of 45 nm or less.

* * * * *